United States Patent
Takamoto et al.

(10) Patent No.: US 12,196,822 B2
(45) Date of Patent: Jan. 14, 2025

(54) SEMICONDUCTOR DEVICE

(71) Applicant: Hitachi Astemo, Ltd., Hitachinaka (JP)

(72) Inventors: Tomoki Takamoto, Ibaraki (JP); Akeo Satoh, Ibaraki (JP); Akira Kotabe, Ibaraki (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 162 days.

(21) Appl. No.: 17/925,643

(22) PCT Filed: Jan. 29, 2021

(86) PCT No.: PCT/JP2021/003176
§ 371 (c)(1),
(2) Date: Nov. 16, 2022

(87) PCT Pub. No.: WO2021/245975
PCT Pub. Date: Dec. 9, 2021

(65) Prior Publication Data
US 2023/0194628 A1   Jun. 22, 2023

(30) Foreign Application Priority Data

Jun. 1, 2020 (JP) .................................. 2020-095264

(51) Int. Cl.
*G01R 31/58* (2020.01)
*G01R 31/28* (2006.01)

(52) U.S. Cl.
CPC ......... *G01R 31/58* (2020.01); *G01R 31/2884* (2013.01)

(58) Field of Classification Search
CPC ................ G01R 31/58; G01R 31/2884; G01R 31/2829; G01R 31/54
USPC .......................................... 324/762.01, 762.1
See application file for complete search history.

(56) References Cited

U.S. PATENT DOCUMENTS

| 8,796,048 B1 * | 8/2014 | Thompson ............. H01L 22/30 438/638 |
| 2017/0131099 A1 * | 5/2017 | Aoyama ............ G01C 19/5642 |

FOREIGN PATENT DOCUMENTS

| JP | 5-324153 A | 12/1993 |
| JP | 2015-110295 A | 6/2015 |
| JP | 2017-90208 A | 5/2017 |
| JP | 2018-29285 A | 2/2018 |

OTHER PUBLICATIONS

Translation of JPH 05324153 (Year: 1993).*

(Continued)

*Primary Examiner* — Christopher P McAndrew
(74) *Attorney, Agent, or Firm* — Crowell & Moring LLP

(57) ABSTRACT

An object of the present invention is to provide a semiconductor device capable of diagnosing disconnection of a signal line that transmits a command signal in an inspection process even if the command signal is assumed not to be transmitted in the inspection process. A semiconductor device according to the present invention includes a first semiconductor integrated circuit and a control circuit, the control circuit includes a means for controlling a signal line in response to a response signal from the first semiconductor integrated circuit, and the control circuit further includes a means for controlling the signal line regardless of a signal from the first semiconductor integrated circuit.

14 Claims, 8 Drawing Sheets

(56) References Cited

OTHER PUBLICATIONS

Translation of JP 2018-029285. (Year: 2018).*
International Search Report (PCT/ISA/210) issued in PCT Application No. PCT/JP2021/003176 dated May 25, 2021 with English translation (four (4) pages).

* cited by examiner

SEMICONDUCTOR DEVICE

TECHNICAL FIELD

The present invention relates to a semiconductor device.

BACKGROUND ART

The physical quantity measuring device is a device that acquires data representing physical quantities by a control circuit (a semiconductor element such as a processor) performing arithmetic processing on a measurement signal output by, for example, a humidity sensor, a flow rate sensor, or the like measuring the physical quantities. In order to reduce cost, recent physical quantity measuring devices may suppress the number of interfaces for communicating with other circuits.

In a process of manufacturing a physical quantity measuring device, a device (for example, large-scale integrated circuit: LSI) equipped with a control circuit is inspected. In the inspection process, a physical quantity sensor and a control circuit are connected via a sensor terminal, for example, and a command is transmitted from the control circuit to the physical quantity sensor to diagnose whether or not a response signal is obtained.

PTL 1 below describes a physical quantity detection circuit. With an object of "To provide a physical quantity detection circuit, an electronic apparatus and a mobile body capable of improving the accuracy of failure detection in a synchronous detection circuit.", the literature discloses a technique of "A physical quantity detection circuit (angular velocity signal processing circuit 4) comprises: a synchronous detection circuit 350 for synchronously detecting a signal to be detected including a detected signal corresponding to a physical quantity and a leakage signal of oscillation based on a drive signal from a physical quantity detection element which generates the detected signal and the leakage signal, according to a detection signal, by oscillation based on the drive signal; and a phase difference change circuit 350 for switching a phase difference between the detection signal and the signal to be detected to a first phase difference and a second phase difference different from the first phase difference so that at least a part of the leakage signal is output by the synchronous detection." (see Abstract).

CITATION LIST

Patent Literature

PTL 1: JP 2017-090208 A

SUMMARY OF INVENTION

Technical Problem

Some signal lines connecting a physical quantity measuring device and a physical quantity sensor are driven only when the physical quantity sensor is abnormal (for example, the signal level of the signal line becomes high). For example, the control circuit transmits a command to the physical quantity sensor, and when no response signal is obtained, the control circuit transmits a reset signal to the physical quantity sensor to causes the physical quantity sensor to transition to a reset state. Therefore, a reset signal line in this case is a signal line that is driven only when the physical quantity sensor is abnormal.

Upon receiving the reset signal, the physical quantity sensor is expected to transition to a reset state. Therefore, if the destination physical quantity sensor continues to operate in a normal state even though a reset signal is transmitted, it can be estimated that the reset signal line is disconnected and the reset signal has not reached the physical quantity sensor. By this, it is likely that disconnection of the reset signal can be detected.

It is when no response signal is returned from the physical quantity sensor that the control circuit transmits a reset signal. Therefore, it is also when no response signal is returned from the physical quantity sensor whether or not the reset signal line is disconnected can be diagnosed by transmitting a reset signal. However, in the inspection process of the physical quantity measuring device, since the physical quantity sensor is considered to operate normally, the physical quantity sensor returns a response signal. Then, since the control circuit does not have an opportunity to transmit a reset signal, there is no opportunity to diagnose whether or not the reset signal line is disconnected by transmitting the reset signal. That is, in the inspection process, it is difficult to diagnose whether or not the reset signal line is disconnected.

In the conventional physical quantity measuring device as in PTL 1, diagnosis of disconnection of a reset signal line by transmitting a reset signal in an inspection process has not been sufficiently studied.

The present invention has been made in view of the above problems, and an object of the present invention is to provide a semiconductor device capable of diagnosing disconnection of a signal line that transmits a command signal in an inspection process even if the command signal is assumed not to be transmitted in the inspection process.

Solution to Problem

A semiconductor device according to the present invention includes a first semiconductor integrated circuit and a control circuit, the control circuit includes a means for controlling a signal line in response to a response signal from the first semiconductor integrated circuit, and the control circuit further includes a means for controlling the signal line regardless of a signal from the first semiconductor integrated circuit.

Advantageous Effects of Invention

According to the semiconductor device of the present invention, it is possible to diagnose disconnection of a signal line that transmits a command signal in an inspection process even if the command signal is assumed not to be transmitted in the inspection process. Further problems, configurations, advantages, and the like of the present invention will be apparent from the description of embodiments described below.

DESCRIPTION OF EMBODIMENTS

First Embodiment

Figure 1:
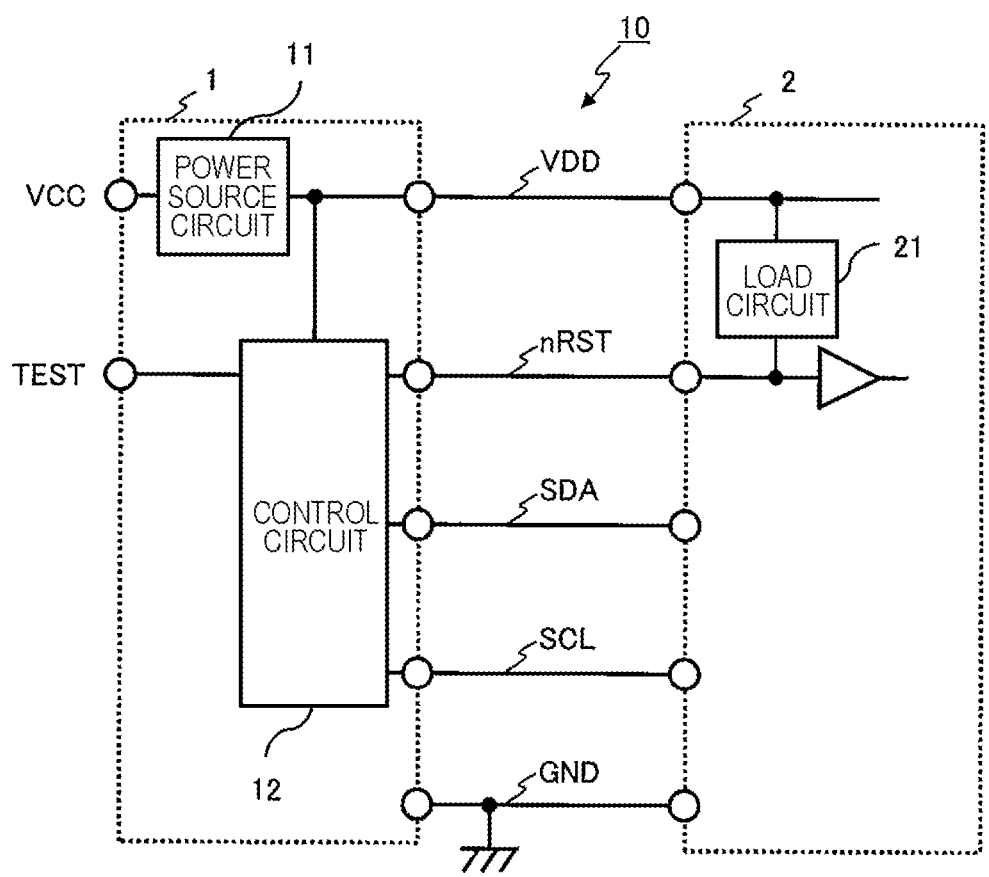
FIG. 1 is a circuit configuration diagram of a physical quantity measuring device 10 according to a first embodiment.

FIG. 1 is a circuit configuration diagram of the physical quantity measuring device 10 according to the first embodiment of the present invention. The physical quantity measuring device 10 includes a large scale integration (LSI) 1 and a humidity sensor 2. The LSI 1 (second semiconductor integrated circuit) receives, from the humidity sensor 2, a signal indicating a physical quantity (flow rate of fluid) measured by the humidity sensor 2 (first semiconductor integrated circuit), analyzes the signal, and outputs data indicating the physical quantity.

The LSI 1 and the humidity sensor 2 are connected by a power source line VDD, a reset signal line nRST, a data signal line SDA, a synchronization signal line SCL, and a ground line GND (these wirings correspond to "a plurality of signal lines").

The power source line VDD supplies power from a power source circuit 11 to the humidity sensor 2. The ground line GND connects the LSI 1 and the humidity sensor 2 to a reference potential (ground potential). The data signal line SDA is a signal line for data transmission and reception in inter-integrated circuit (I2C) communication. The synchronization signal line SCL is a signal line for a synchronization signal in I2C communication.

The LSI 1 includes the power source circuit 11, the control circuit 12, a test terminal TEST, and the power source terminal VCC. The control circuit 12 transmits a command signal and a reset signal to the humidity sensor 2. The test terminal TEST will be described later.

The humidity sensor 2 includes the load circuit 21. The load circuit 21 is arranged so as to connect between the power source line VDD and the reset signal line nRST. This causes the reset signal line nRST to be pulled up by power source voltage. Therefore, the control circuit 12 sets nRST to a high level when operating the humidity sensor 2 in the normal state, and sets nRST to a low level when causing the humidity sensor 2 to transition to the reset state. This allows the control circuit 12 to transmit a reset signal to the humidity sensor 2.

The control circuit 12 transmits a command to the humidity sensor 2 via the data signal line SDA. When the humidity sensor 2 is operating normally, the humidity sensor 2 returns a response signal via the data signal line SDA. When the response signal is not returned due to some error or the like in the humidity sensor 2 (or when the humidity sensor 2 returns an error), the control circuit 12 transmits a reset signal to the humidity sensor 2 via the reset signal line nRST. If the reset signal line nRST is not disconnected, the humidity sensor 2 transitions to the reset state, and if the reset signal line nRST is disconnected, the humidity sensor 2 continues to operate. Therefore, the control circuit 12 can diagnose whether or not the reset signal line nRST is disconnected based on whether or not the humidity sensor 2 continues to operate by transmitting the reset signal.

However, in the inspection process of the physical quantity measuring device 10, since the humidity sensor 2 is considered to operate normally, the humidity sensor 2 always returns a response signal. Then, in the inspection process, since the control circuit 12 does not have an opportunity to transmit the reset signal to the humidity sensor 2, it is not possible to diagnose disconnection of the reset signal line nRST using the reset signal. Therefore, in the first embodiment, the control circuit 12 includes a means for transmitting a reset signal to the humidity sensor 2 regardless of whether or not a response signal is returned from the humidity sensor 2.

As a specific example, the control circuit 12 may transmit a reset signal to the humidity sensor 2 regardless of how the humidity sensor 2 operates with respect to the command transmitted to the humidity sensor 2. For example, the control circuit 12 is notified that the inspection process is being performed by some method, and upon receiving the notification, the control circuit 12 transmits a reset signal to the humidity sensor 2. This makes it possible to diagnose disconnection of the reset signal line nRST even when the humidity sensor 2 is operating normally.

Figure 2:
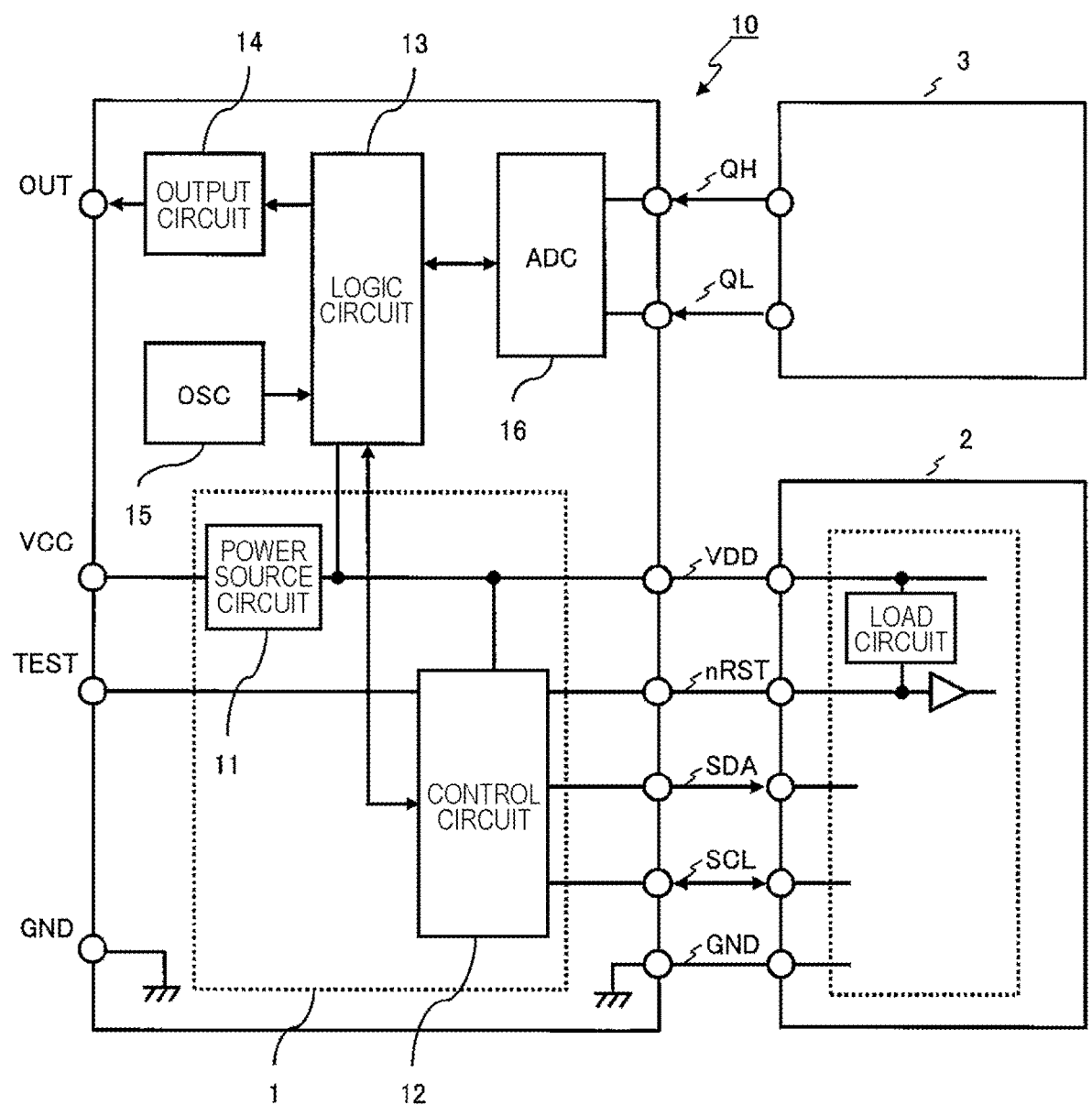
FIG. 2 is a view illustrating another configuration example of the physical quantity measuring device 10.

FIG. 2 is a view illustrating another configuration example of the physical quantity measuring device 10. In FIG. 2, the physical quantity measuring device 10 includes a flow rate sensor 3, in addition to the humidity sensor 2, as physical quantity sensors. In addition to the LSI 1, an AD converter 16, a logic circuit 13, an output circuit 14, and an oscillator 15 are included.

The flow rate sensor 3 outputs, by signals QH and QL, a result of measuring the humidity. The AD converter 16 receives the signals QH and QL, converts them into digital signals, and outputs them to the logic circuit 13. Difference voltage between the signal QH and the signal QL is a signal indicating a change in the flow rate. Since the flow rate sensor 3 does not include a circuit for executing a command from the control circuit 12, it is not necessary to reset the flow rate sensor 3. Therefore, in FIG. 2, the flow rate sensor 3 is not connected to the reset signal line nRST. In a case of connecting a sensor that needs to be reset, it is only required to connect the reset signal line nRST similarly to the humidity sensor 2.

The logic circuit 13 controls the control circuit 12. The logic circuit 13 receives the measurement result of the humidity sensor 2 via the control circuit 12 and receives the measurement result of the flow rate sensor 3 via the AD converter 16. The logic circuit 13 outputs each measurement result via the output circuit 14. The oscillator 15 provides a clock signal to the logic circuit 13.

Similarly to the operation described with reference to FIG. 1, the logic circuit 13 and the LSI 1 can transmit a reset signal to the humidity sensor 2 regardless of whether or not the humidity sensor 2 responds to the command.

Second Embodiment

Figure 3:
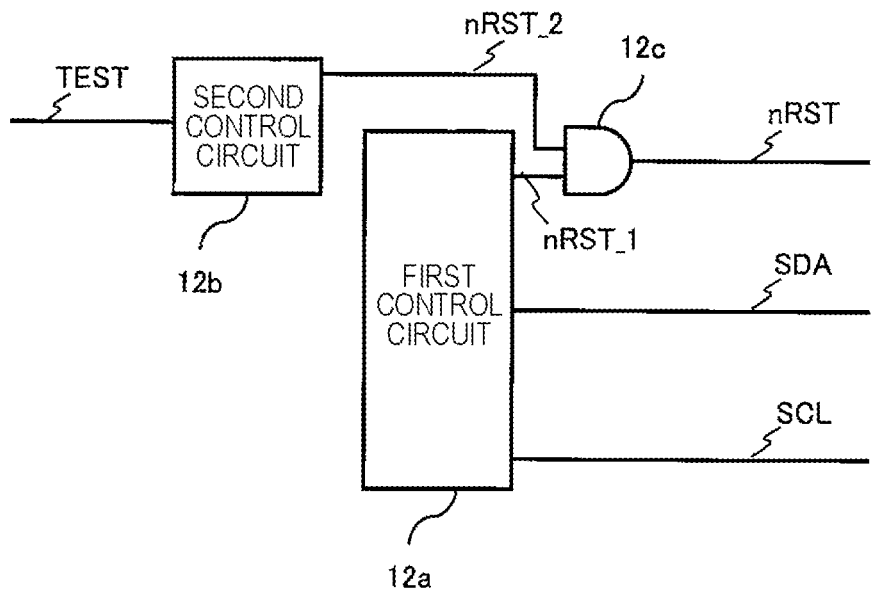
FIG. 3 is a view describing the configuration of the physical quantity measuring device 10 according to a second embodiment.

FIG. 3 is a view describing the configuration of the physical quantity measuring device 10 according to the second embodiment of the present invention. In the second embodiment, the control circuit 12 includes a first control circuit 12a, a second control circuit 12b, and an AND circuit 12c. Other configurations are similar to those of the first embodiment.

The first control circuit 12a transmits a command to the humidity sensor 2 similarly to the first embodiment. When the humidity sensor 2 does not respond to the command or does not perform the operation designated by the command, the first control circuit 12a transmits a reset signal to the humidity sensor 2. That is, the first control circuit 12a controls the humidity sensor 2 in response to the response from the humidity sensor 2.

The second control circuit 12b transmits a reset signal to the humidity sensor 2 in accordance with a signal input to the test terminal TEST. That is, the second control circuit 12b controls the humidity sensor 2 regardless of the response from the humidity sensor 2.

The AND circuit 12c aggregates the signal output from the first control circuit 12a to the reset signal line nRST and the signal output from the second control circuit 12b to the reset signal line nRST, and outputs a logical product of them to the reset signal line nRST. Therefore, what is finally output to the reset signal line nRST is the output of the AND circuit 12c.

Figure 4:
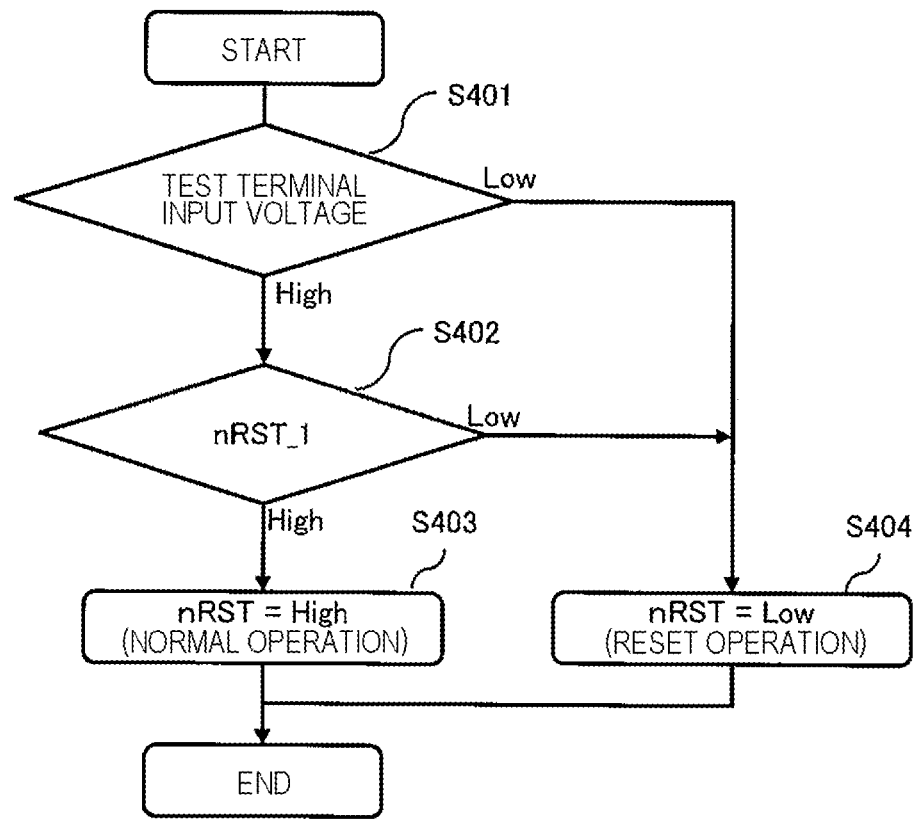
FIG. 4 is a flowchart illustrating operation of a control circuit 12 in the second embodiment.

FIG. 4 is a flowchart illustrating operation of the control circuit 12 in the second embodiment. When a low level signal is input to the test terminal TEST (S401: Low), the second control circuit 12b outputs low level to the signal line nRST_2. Therefore, since the output of the AND circuit 12c also becomes the low level, the reset signal line nRST also becomes the low level (reset instruction) (S404).

When a high level signal is input to the test terminal TEST (S401: High), the second control circuit 12b outputs high level to the signal line nRST_2.

When the humidity sensor 2 responds to the command, the first control circuit 12a outputs high level to the signal line nRST_1 (S402: High). In this case, since the output of the AND circuit 12c becomes the high level, the reset signal line nRST becomes the high level (normal operation) (S403).

When the humidity sensor 2 does not respond to the command, the first control circuit 12a outputs the low level to the signal line nRST_1 (S402: Low). In this case, since the output of the AND circuit 12c becomes the low level, the reset signal line nRST becomes the low level (reset instruction) (S404).

When a low level signal is input to the test terminal TEST (S401: Low), the second control circuit 12b outputs low level to the signal line nRST_2. In this case, since the output of the AND circuit 12c becomes the low level, the reset signal line nRST becomes the low level (reset instruction) (S404).

According to the above operation, when the high level is input to the test terminal TEST, the reset signal is controlled according to whether or not the first control circuit 12a receives a response from the humidity sensor 2. On the other hand, when the low level is input to the test terminal TEST, a reset signal is transmitted to the humidity sensor 2 regardless of whether or not a response is received from the humidity sensor 2. Therefore, when performing the inspection process, it is only required to input the low level the test terminal TEST.

In the second embodiment, the AND circuit 12c only needs to output the logical product of outputs from the first control circuit 12a and the second control circuit 12b, and thus does not necessarily need to be configured by the AND circuit itself. In other words, as long as the logical product of these outputs can be finally output to the reset signal line nRST, the AND circuit 12c may be replaced by an arbitrary logic circuit.

Third Embodiment

Figure 5:
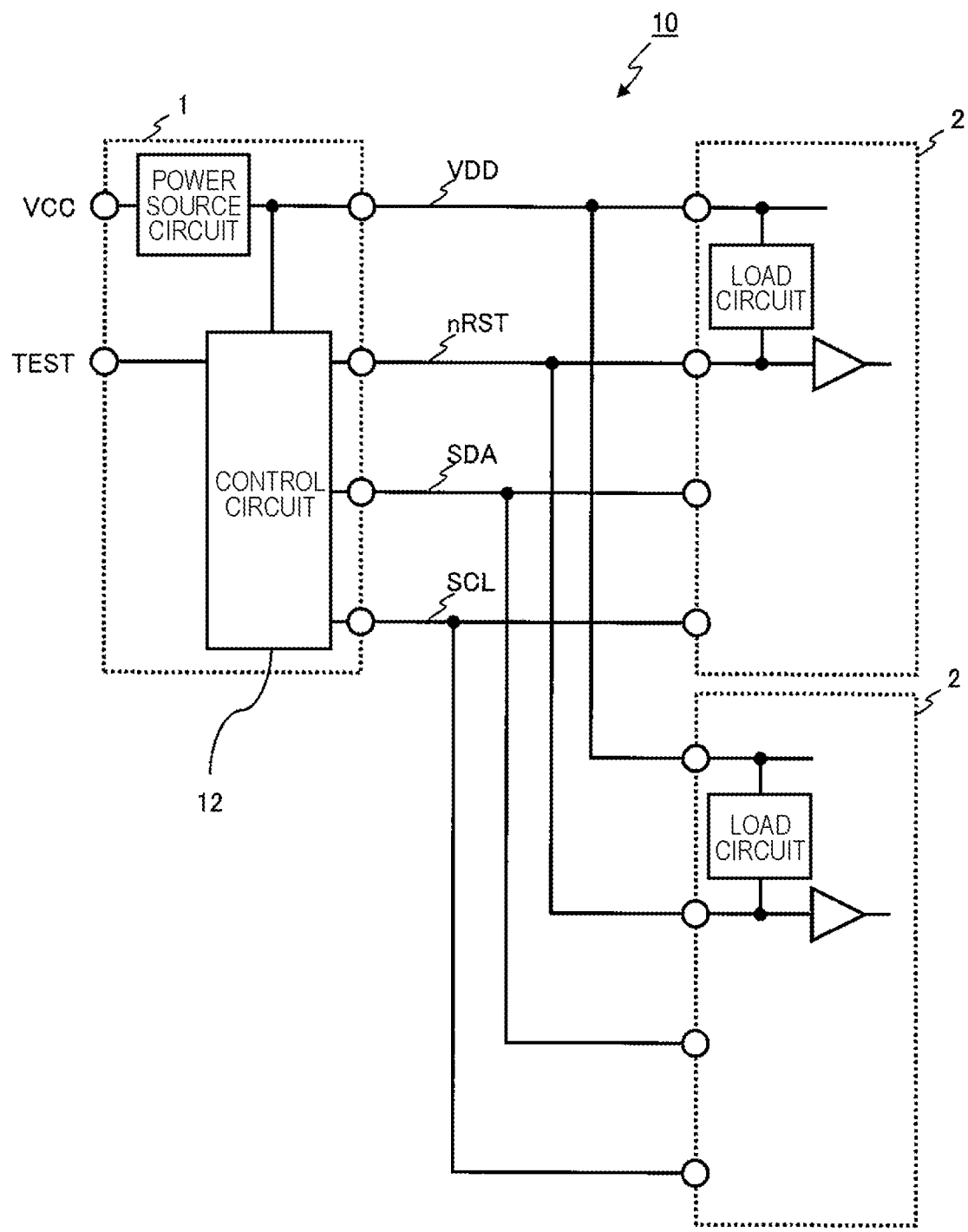
FIG. 5 is a configuration diagram of the physical quantity measuring device 10 according to a third embodiment.

FIG. 5 is a configuration diagram of the physical quantity measuring device 10 according to the third embodiment of the present invention. In the third embodiment, the physical quantity measuring device 10 includes two humidity sensors 2. Each of the humidity sensors 2 communicates with the LSI 1 using an I2C protocol. Each of the humidity sensors 2 is connected in parallel to the LSI 1, and the LSI 1 transmits the same command (including a reset signal) to each of the humidity sensors 2. Therefore, the LSI 1 transmits the reset signal to all the humidity sensors 2. Other configurations are the same as those in the first and second embodiments.

According to the configuration illustrated in FIG. 5, (a) when any of the humidity sensors 2 does not respond to the command, the LSI 1 transmits a reset signal to all the humidity sensors 2, and (b) when the inspection process is performed, the LSI 1 transmits a reset signal to all the humidity sensors 2. The same applies when there are three or more humidity sensors 2. This makes it possible to achieve the same operation as in the first and second embodiments even in a case of including a plurality of humidity sensors 2.

In a case of individually transmitting a command to each of the humidity sensors 2, for example, it is only required to separately provide a chip select signal line or the like, and transmit the command after selecting in advance any of the humidity sensors 2. The humidity sensor 2 responds to the command only when the humidity sensor 2 is selected in advance. However, regarding the reset signal, all the humidity sensors 2 may perform the same operation (that is, reset) regardless of whether or not being selected.

Figure 6:
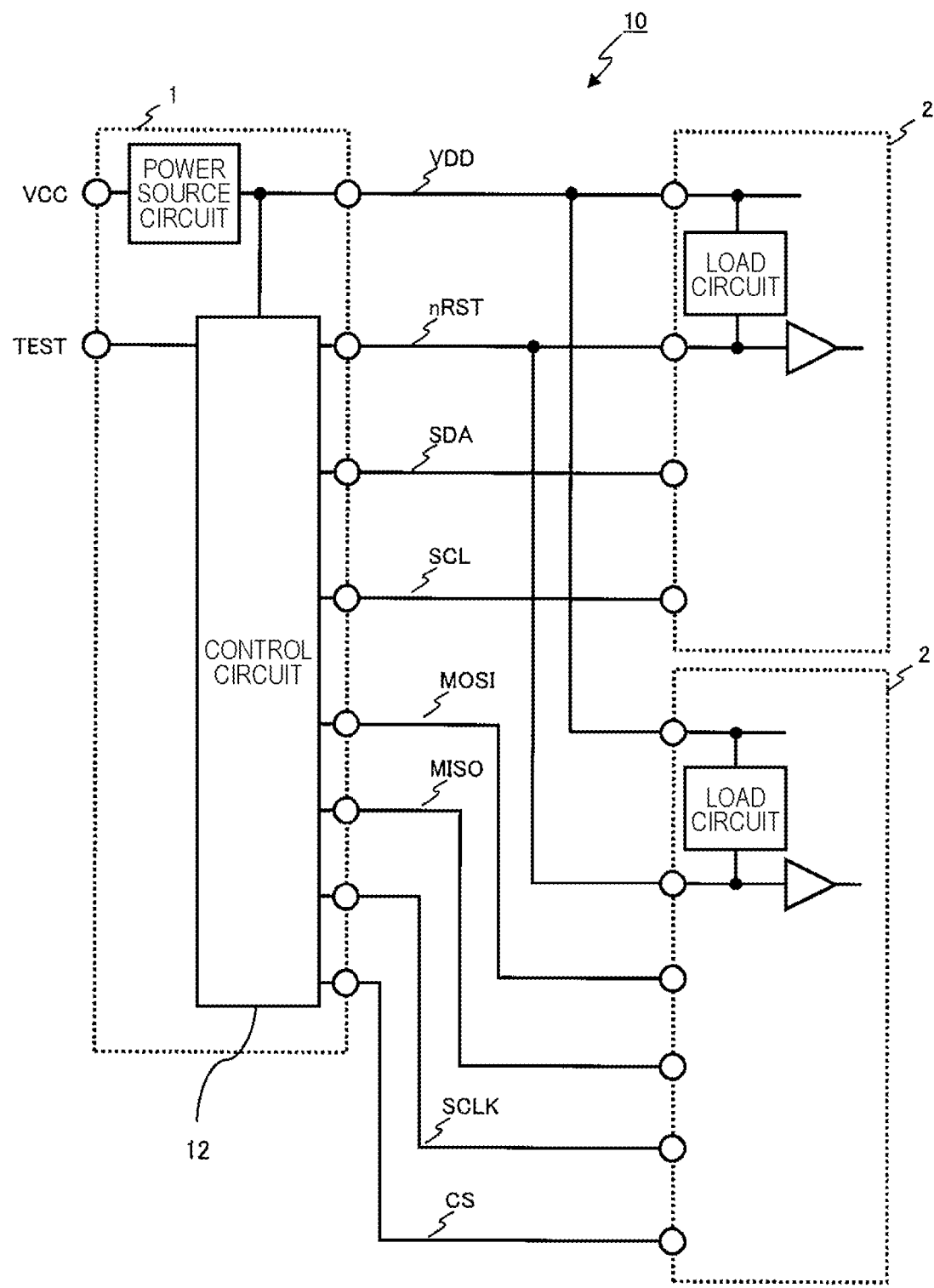
FIG. 6 is a view illustrating another configuration example of the physical quantity measuring device 10 according to the third embodiment.

FIG. 6 is a view illustrating another configuration example of the physical quantity measuring device 10 according to the third embodiment. In FIG. 6, the first humidity sensor 2 and the LSI 1 communicate with each other by an I2C protocol, and the second humidity sensor 2 and the LSI 1 communicate with each other by a serial peripheral interface (SPI) protocol. Specifically, the second humidity sensor 2 uses four signals of a master input slave input (MOSI), a master input slave output (MISO), a clock (SCLK), and a chip select (CS).

Also in the configuration illustrated in FIG. 6, the LSI 1 operates similarly to FIG. 5. However, the command for the second humidity sensor 2 conforms to the SPI protocol. This makes it possible to achieve the same operation as in the first and second embodiments even in a case where the plurality of humidity sensors 2 communicate with each other using different communication protocols.

Fourth Embodiment

Figure 7:
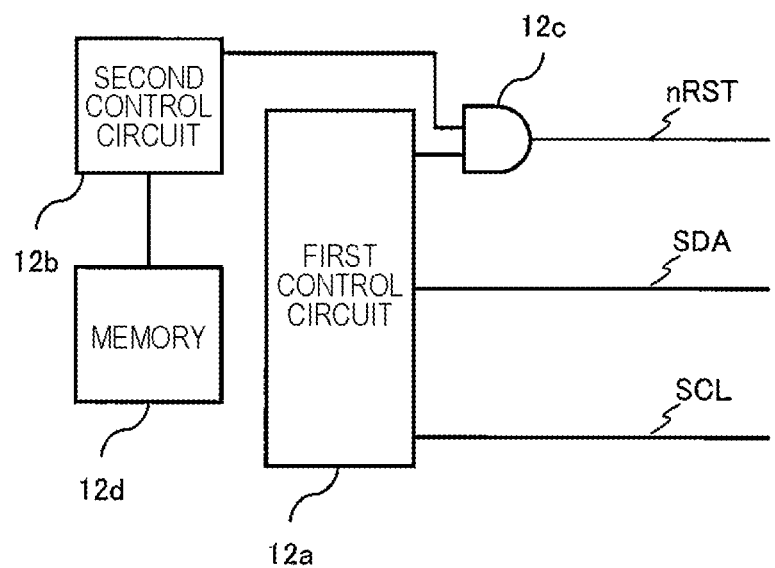
FIG. 7 is a view describing the configuration of the physical quantity measuring device 10 according to a fourth embodiment.

FIG. 7 is a view describing the configuration of the physical quantity measuring device 10 according to the fourth embodiment of the present invention. In the fourth embodiment, the second control circuit 12b is connected to a memory 12d in place of the test terminal TEST. Since other configurations are similar to those of the second embodiment, differences from the second embodiment will be mainly described below.

The second control circuit 12b receives an instruction value from a specific storage area of the memory 12d in place of input from the test terminal TEST. The second control circuit 12b outputs low level if the instruction value is a value instructing to output the reset signal, and outputs high level if the instruction value is a value instructing the normal operation. The subsequent operation is the same as that of the second embodiment.

The instruction value stored in the memory 12d may be stored in the logic circuit 13, for example, or may be input from an external terminal such as the test terminal TEST. The instruction value may be notified to the logic circuit 13 or the control circuit 12 by other appropriate means, and the logic circuit 13 or the control circuit 12 may store the instruction value into the memory 12d.

In the fourth embodiment, the second control circuit 12b may use the test terminal TEST in combination. For example, the low level may be output when at least any of the instruction value stored in the memory 12d and the input from the test terminal TEST is the low level or a value corresponding thereto.

In the fourth embodiment, even without the test terminal TEST, the control circuit 12 can determine by itself whether or not to output the reset signal. Therefore, for example, by configuring the memory 12d as a part of the LSI 1 and storing the instruction value, the physical quantity measuring device 10 can diagnose disconnection of the reset signal line in a stand-alone manner.

Fifth Embodiment

Figure 8:
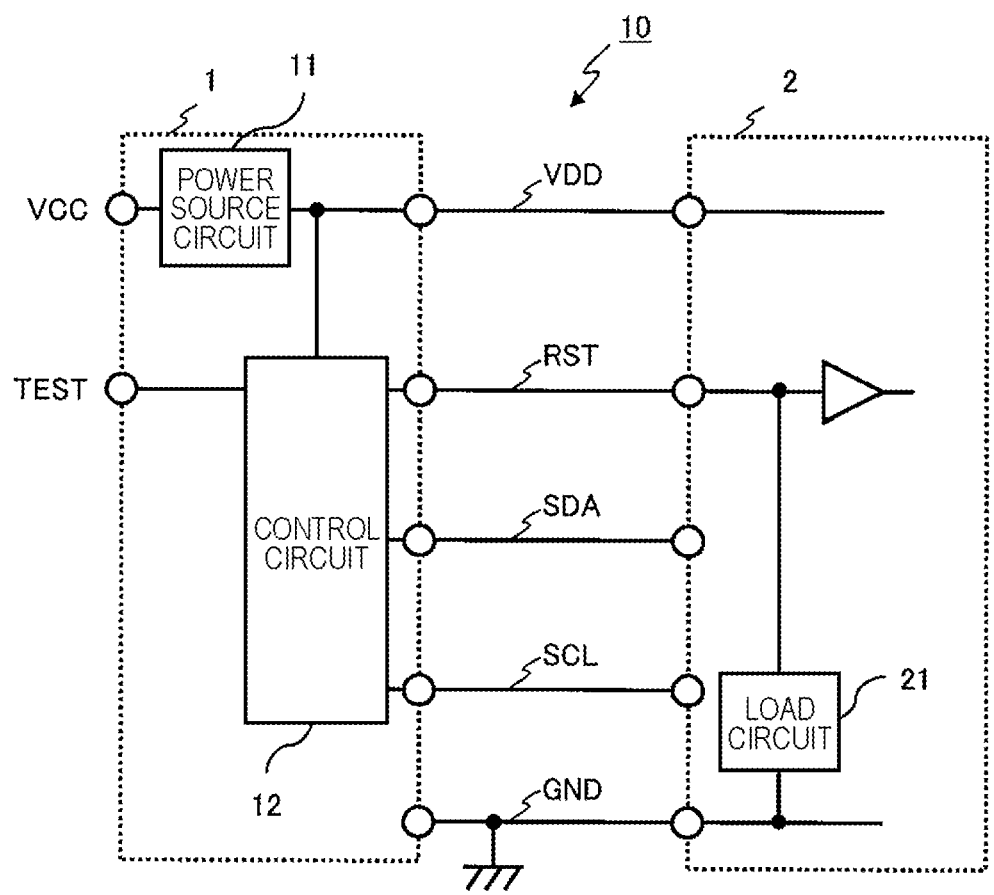
FIG. 8 is a configuration diagram of the physical quantity measuring device 10 according to a fifth embodiment.

FIG. 8 is a configuration diagram of the physical quantity measuring device 10 according to the fifth embodiment of the present invention. In the fifth embodiment, the load circuit 21 is arranged so as to connect between the ground line GND and the reset signal line nRST. Due to this, the reset signal line nRST is pulled down by the ground voltage. Therefore, the control circuit 12 sets nRST to the low level when operating the humidity sensor 2 in the normal state, and sets nRST to the high level when causing the humidity sensor 2 to transition to the reset state. This allows the control circuit 12 to transmit a reset signal to the humidity sensor 2. Other configurations are similar to those of the first to fourth embodiments.

Even in a case where the load circuit 21 included in the humidity sensor 2 is pulled down as in the fifth embodiment, the LSI 1 can transmit, similarly to the first to fourth embodiments, the reset signal regardless of whether or not the humidity sensor 2 responds. It is therefore possible to achieve the same operation similarly to the first to fourth embodiments.

Sixth Embodiment

Figure 9A:
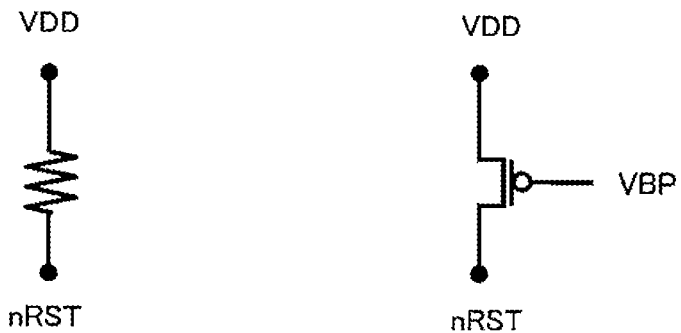
FIG. 9A is a view illustrating a configuration example of a load circuit 21.

FIG. 9A is a view illustrating the configuration example of the load circuit 21. The load circuit 21 can be configured by, for example, a resistive element as in the left in FIG. 9A, or can be configured by a switching element as in the right in FIG. 9A. Other configurations are the same as those in the first to fifth embodiments.

Figure 9B:
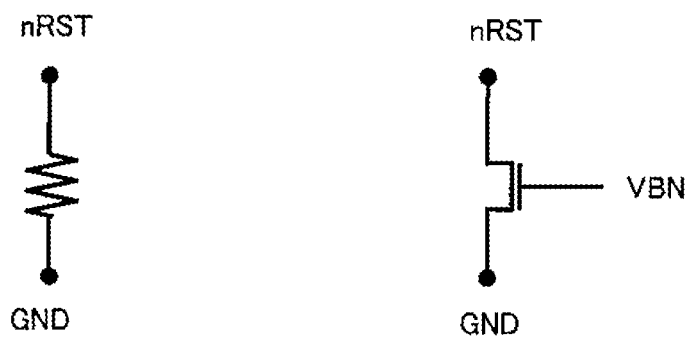
FIG. 9B is a view illustrating a configuration example of the load circuit 21.

FIG. 9B is a view illustrating the configuration example of the load circuit 21. Even in the configuration in which the load circuit 21 is pulled down as in the fifth embodiment, the load circuit 21 can be configured by a resistive element or a switching element. Other configurations are the same as those in the first to fifth embodiments.

Modifications of Present Invention

The present invention is not limited to the above-described embodiments, and includes various modifications.

For example, the above-described embodiments have been described in detail in order to describe the present invention in an easy-to-understand manner, and are not necessarily limited to those having all the described configurations. It is also possible to replace a part of the configuration of a certain embodiment with the configuration of another embodiment, and it is also possible to add the configuration of another embodiment to the configuration of the certain embodiment. Another configuration can be added to, deleted from, or replaced with a part of the configuration of each embodiment.

In the above-described embodiments, the circuit elements of the LSI 1 and the humidity sensor 2 may be integrated into one integrated circuit or the like. Similarly, circuit elements of the other sensors may be integrated with the LSI 1.

In the above-described embodiments, it has been described that the control circuit 12 can transmit the reset signal to the humidity sensor 2 regardless of whether or not the humidity sensor 2 responds. The signal that can be transmitted regardless of a response from the sensor is not limited to the reset signal, and other signals may be transmitted. That is, the method according to the present invention can be applied in a case where a signal configured to be transmitted only when a specific condition is satisfied is needed to transmit regardless of whether or not the condition is satisfied.

In the above-described embodiments, a configuration example of the physical quantity measuring device 10 including the LSI 1 and the sensors has been described, but the present invention is not limited to this. That is, the present invention can be applied to other semiconductor devices that transmit commands from the first semiconductor circuit to the second semiconductor circuit.

In the above-described embodiments, the control circuit 12 and the logic circuit 13 can be configured by hardware such as a circuit device in which these functions are implemented, or can be configured by an arithmetic device such as a central processing unit (CPU) executing software in which these functions are implemented. In the present embodiment, the communication method has been described with examples of I2C and SPI, but the present invention can also be applied to a communication protocol for performing communication confirmation such as controller area network (CAN) communication.

REFERENCE SIGNS LIST

1 LSI
2 humidity sensor
3 flow rate sensor
10 physical quantity measuring device
11 power source circuit
12 control circuit
12a first control circuit
12b second control circuit
12c AND circuit
12d memory
21 load circuit

The invention claimed is:
1. A semiconductor device comprising:
a first semiconductor integrated circuit including an input circuit including a load circuit;
a second semiconductor integrated circuit including a control circuit for communicating with the first semiconductor integrated circuit; and a plurality of signal lines connecting the first semiconductor integrated circuit and the second semiconductor integrated circuit,
wherein
the control circuit includes
a means for controlling each of the signal lines in response to a response signal from the first semiconductor integrated circuit, and
a means for controlling each of the signal lines regardless of a signal from the first semiconductor integrated circuit,
the means for controlling each of the signal lines in response to the response signal from the first semiconductor integrated circuit includes a first control circuit, and
the means for controlling each of the signal lines regardless of the signal from the first semiconductor integrated circuit includes a second control circuit different from the first control circuit.

2. The semiconductor device according to claim 1, wherein
the means for controlling each of the signal lines regardless of a signal from the first semiconductor integrated circuit transmits a command designating a state of the first semiconductor integrated circuit to the first semiconductor integrated circuit via the signal line, and
when the state of the first semiconductor integrated circuit is not a state designated by the command, the control circuit outputs a signal indicating that the signal line through which the command has been transmitted is disconnected.

3. The semiconductor device according to claim 1, wherein at least one of the plurality of signal lines is a reset signal line through which a reset signal for causing the first semiconductor integrated circuit to transition to a reset state is transmitted to the first semiconductor integrated circuit.

4. The semiconductor device according to claim 3, wherein
the means for controlling each of the signal lines in response to a response signal from the first semiconductor integrated circuit transmits a command to the first semiconductor integrated circuit, and when a response signal to the command is not returned from the first semiconductor integrated circuit, the means for controlling each of the signal lines in response to a response signal from the first semiconductor integrated circuit transmits the reset signal via the reset signal line, and
the means for controlling each of the signal lines regardless of a signal from the first semiconductor integrated circuit transmits the reset signal via the reset signal line regardless of whether or not a response signal to the command is returned from the first semiconductor integrated circuit.

5. The semiconductor device according to claim 1, wherein
the control circuit further includes a logic circuit arranged between the signal line and the control circuit, and
the logic circuit outputs, to the signal line, a logical product of
a signal output by the means for controlling each of the signal lines in response to a response signal from the first semiconductor integrated circuit, and
a signal output by the means for controlling the each of the signal lines regardless of a signal from the first semiconductor integrated circuit.

6. The semiconductor device according to claim 1, further comprising an external terminal for inputting an instruction signal to the control circuit, wherein
the means for controlling each of the signal lines regardless of a signal from the first semiconductor integrated circuit controls the signal line in accordance with the instruction signal received via the external terminal.

7. The semiconductor device according to claim 5, wherein
the logic circuit outputs, to the signal line, a logical product of a signal output from the first control circuit and a signal output from the second control circuit.

8. The semiconductor device according to claim 1, further comprising a third semiconductor integrated circuit including a second load circuit, wherein
the third semiconductor integrated circuit and the second semiconductor integrated circuit are connected via a second signal line, and
the control circuit includes
a means for controlling the second signal line in response to a response signal from the third semiconductor integrated circuit, and
a means for controlling the second signal line regardless of a signal from the third semiconductor integrated circuit.

9. The semiconductor device according to claim 1, further comprising a storage device that stores an instruction value for giving an instruction to the control circuit, wherein
the means for controlling each of the signal lines regardless of a signal from the first semiconductor integrated circuit controls the signal line in accordance with the instruction value stored in the storage device.

10. The semiconductor device according to claim 3, wherein
at least one of the plurality of signal lines is a power source line for supplying power from a power source circuit included in the second semiconductor integrated circuit to the first semiconductor integrated circuit,
the load circuit is configured to pull up the reset signal line by connecting between the power source line and the reset signal line,
the means for controlling each of the signal lines in response to a response signal from the first semiconductor integrated circuit transmits the reset signal by setting the reset signal line to low level, and
the means for controlling each of the signal lines regardless of a signal from the first semiconductor integrated circuit transmits the reset signal by setting the reset signal line to low level.

11. The semiconductor device according to claim 3, wherein
at least one of the plurality of signal lines is a reference potential line connected to a reference potential,
the load circuit is configured to pull down the reset signal line by connecting between the reference potential line and the reset signal line,
the means for controlling each of the signal lines in response to a response signal from the first semiconductor integrated circuit transmits the reset signal by setting the reset signal line to high level, and
the means for controlling each of the signal line regardless of a signal from the first semiconductor integrated circuit transmits the reset signal by setting the reset signal line to high level.

12. The semiconductor device according to claim 1, wherein
- the first semiconductor integrated circuit includes a sensor circuit including at least any of a humidity sensor, a pressure sensor, and a temperature sensor, and
- the second semiconductor integrated circuit controls the sensor circuit by transmitting a command to the first semiconductor integrated circuit via the signal line.

13. The semiconductor device according to claim 1, wherein
- the first semiconductor integrated circuit includes a sensor circuit configured as a flow rate sensor, and
- the flow rate sensor and the second semiconductor integrated circuit are integrally configured as one semiconductor integrated circuit.

14. The semiconductor device according to claim 1, wherein the load circuit includes a resistive element or a switching element.

* * * * *